United States Patent [19]

Nishiura et al.

[11] Patent Number: 4,665,008

[45] Date of Patent: May 12, 1987

[54] METHOD FOR FABRICATING THIN-FILM IMAGE SENSING DEVICES

[75] Inventors: Masaharu Nishiura; Toshiaki Katou, both of Yokosuka, Japan

[73] Assignee: Fuji Electric Co., Ltd., Kawasaki, Japan

[21] Appl. No.: 801,932

[22] Filed: Nov. 26, 1985

[30] Foreign Application Priority Data

Nov. 26, 1984 [JP] Japan ................... 59-249996
Nov. 27, 1984 [JP] Japan ................... 59-249267

[51] Int. Cl.$^4$ ............................................. G03C 5/00
[52] U.S. Cl. ...................... 430/314; 430/316; 430/318; 430/319; 430/330; 250/578; 156/650; 156/655; 156/659.1; 156/665; 156/667
[58] Field of Search ............. 430/313, 314, 316, 318, 430/319, 330; 250/578; 358/212, 213; 156/650, 654, 655, 659.1, 665, 667

[56] References Cited

U.S. PATENT DOCUMENTS

| 3,941,630 | 3/1976 | Larrabee | 156/650 |
| 4,227,078 | 10/1980 | Yamamoto et al. | 250/227 |
| 4,336,295 | 6/1982 | Smith | 428/195 |
| 4,565,928 | 1/1986 | Yamamoto et al. | 250/578 |

Primary Examiner—John E. Kittle
Assistant Examiner—José G. Dees
Attorney, Agent, or Firm—Brumbaugh, Graves, Donohue & Raymond

[57] ABSTRACT

A method is provided for fabricating thin film amorphous silicon p-i-n photodiode array image sensors that have transparent photodiode electrodes made of indium tin oxide or $SnO_2$ and thin-film aluminum conductors for connecting the transparent electrodes to signal processing circuitry. The method provides for patterning of the aluminum conductors without eroding the material of the transparent electrodes through reduction of such material by hydrogen gas released during etching of the aluminum by using a photoresist etch mask that covers the areas of the transparent electrodes and defines the pattern of the aluminum conductors.

18 Claims, 12 Drawing Figures

METHOD FOR FABRICATING THIN-FILM IMAGE SENSING DEVICES

BACKGROUND OF THE INVENTION

The present invention relates to a method for fabricating thin-film image sensing devices and, more particularly, to a method for fabricating image sensing devices that include electrodes of transparent conducting material connected to thin-film metal conductors.

In the development of high-speed, high-resolution facsimile equipment, it has become necessary to provide image sensors comprising large, high density arrays of photodetectors which are capable of fast response and high sensitivity to small changes in light intensity. A typical scanning arrangement used in facsimile equipment is illustrated in FIG. 1. With reference with FIG. 1, a manuscript 1 moves in a transverse direction relative to a linear image sensor 2 comprising a linear array of regularly spaced photodetectors 3, which extend across the width of the manuscript 1. The image of one line of the manuscript at a time is focused onto the photodetector array 3 by a Selfoclens 5. The manuscript is illuminated by two linear arrays of light emitting diodes 4 situated on each side of the Selfoclens 5.

In order to meet the requirements of high speed, high-resolution facsimile equipment currently being developed, it is generally desirable for the photodetectors of the linear array to have a pitch of approximately 8 per mm or 16 per mm, depending upon the expected size of the patterns in the manuscript to be scanned. The active area of each photodetector should be approximately 100 μm×100 μm for the larger pitch and 50 μm×50 μm for the smaller pitch. Furthermore, the response time of the photodetectors should be such that an A4 or B4 size manuscript can be scanned at the rate of one line in 4 msec or less.

Formerly, image sensors for facsimile equipment have been constructed with linear arrays of charge-coupled devices (CCD's); however, recently there has been developed image sensors constructed with linear arrays of thin-film semiconductor p-i-n photodiodes. The latter construction provides the advantages of allowing larger arrays to be fabricated with improved performance and lower manufacturing cost.

An exemplary structure for a thin-film, p-i-n photodiode array image sensor is illustrated in FIGS. 2 and 3. Referring to FIGS. 2 and 3, the image sensor 20 comprises a plurality of regularly spaced p-i-n photodiodes 51 disposed in a row. The photodiodes 51 are fabricated by first forming a plurality of separate, regularly-spaced, transparent conducting layers 21 on a major surface of a glass substrate 10. Each of the transparent conducting layers 21 has a square electrode region 22 having dimensions of approximately 100 μm×100 μm or 50 μm×50 μm, depending upon the pitch of the photodiode array, and a strip-like connecting region 23 extending from one side of the electrode region 22. The layers 21 are formed by depositing a film of either indium tin oxide or SnO$_2$ to a thickness in the range of 500Å 2000Å by conventional electron beam evaporation, sputtering or chemical vapor deposition techniques. Following deposition, the transparent conducting film is patterned to form the separate layers 21 by conventional photolithography and etching techniques.

The image sensor 20 further includes an amorphous silicon layer 31 of approximately 1 μm in thickness formed by conventional glow discharge decomposition of SiH$_4$ gas at a relatively low temperature in a reaction chamber containing the substrate 10. The amorphous silicon layer 31 is formed over a predetermined area of the substrate 10, which includes the electrode portion 22 of the transparent conducting layers 21, by using an appropriate metal mask over the substrate 10 while the layer 31 is being formed. During deposition of the amorphous silicon layer 31, diborane gas is initially introduced into the reaction chamber for an appropriate time to create a boron doped p-type impurity layer 32 of approximately 100Å in thickness adjacent the bottom surface of the layer 31, and phosphine gas is introduced into the reaction chamber for an appropriate time at the end of the deposition to create a phosphorus doped n-type impurity layer 33 of approximately 500Å in thickness at the top surface of the layer 31. The portion of the amorphous silicon layer 31 between the p-type and n-type layers 32 and 33 is undoped (i.e., intrinsic).

Following the deposition of the amorphous silicon film, a layer of aluminum 41 of approximately 1 μm in thickness is deposited over a predetermined area of the substrate 10, such that the aluminum layer 41 overlies the electrode portions 22 of the transparent conducting layers 21 and is separated from such layers 21 by the amorphous silicon layer 31. The aluminum layer 41 is formed by conventional electron beam evaporation, while the substrate surface is covered by an appropriate mask.

The above-described image sensor 20 consists of an array of p-i-n photodiodes 51 having a common aluminum cathode electrode 41 and individual transparent anode electrodes 22. The photodiodes 51 are responsive to light incident thereon from the underside of the glass substrate 10 through the transparent anode electrodes 22. The photodetection signals produced by the photodiodes 51 are respectively provided through the connecting regions 23 of the transparent conducting layers 21. The photodetection signals are coupled to an integrated circuit 50 mounted on the substrate 10, which reads and processes such signals. Since the transparent conducting layers 21 have relatively high sheet resistances and the photodiode array 20 is separated from the integrated circuit 50 by a relatively large distance, the conductors 42 that couple the photodetection signals to the integrated circuit 50 are made of low sheet resistance thinfilm metal strips, in order to avoid excessive attenuation of the signals being coupled. The metal strip conductors 42, which are formed by photolithography and etching, contact the connecting regions 23 of respective transparent conducting layers 21 at one end and are connected to respective bonding pads 51 of the integrated circuit 50 at the other end by bonding wires 60 attached by conventional stitch bonding.

For reasons of optimizing the manufacturing yield of the image sensor 20, it is desirable to form the metal strip conductors 42 in a separate metallization step than the one used to form the common cathode electrode 41 and to complete the patterning of the metal strip conductors 42 before the deposition of the amorphous silicon layer 31.

Turning now to FIGS. 4 and 5, there is illustrated a known technique for patterning the metal strip conductors 42 by photolithography and etching. Initially, the transparent conducting layers 21 are formed on the a major surface of the substrate 10 in the manner described above. After patterning of the transparent conducting layers 21, a first metal film 40 consisting of aluminium approximately 1 μm in thickness is deposited over the entire substrate surface by electron beam evaporation followed by the application, exposure and development of a photoresist layer 70 to form an etch mask for the first metal film 40. The pattern of the photoresist layer 70 after development is the desired pattern of the metal strip conductors 42 shown in FIG. 2. Following development, the photoresist layer 70 is subjected to a post-development bake (post bake) at a temperature of approximately 120° C., and the aluminium layer 40 is then etched in a 1:1 mixture of phosphoric acid and nitric acid to remove those portions of the first metal film 40 that are not covered by the patterned photoresist layer 70. After etching the photoresist layer 70 is stripped off to expose the metal strip conductors. The above-described known technique for forming the metal strip conductors has the problem in that the material of the transparent conducting layers 21, which is otherwise impervious to the etchant for aluminum, is reduced to its metallic components by hydrogen gas released when the aluminum film 40 is being etched. Since such metallic components are attacked by the etchant, the known technique for forming the metal strip conductors results in undesirable erosion or total removal of the transparent conducting layers 21.

Accordingly, a need exists for a method for fabricating thin-film photodiode array image sensing devices of the above-specified type in which the metal strip conductors for coupling photodetection signals to signal processing circuitry are formed without erosion or removal of the transparent conducting layers that form the anode electrodes of the photodiodes.

SUMMARY OF THE INVENTION

The foregoing and other problems of the prior art are overcome, in accordance with the present invention, by depositing the first metal film for forming the metal strip conductors over a first predetermined area of the substrate surface to partially overlap the areas of the connecting portions of the transparent conducting layers without overlapping the areas of the electrode portions thereof and patterning the first metal film into the metal strip conductors by forming a first etch mask over the substrate surface after depositing the first metal film and exposing the unmasked portions of the first metal film to a suitable etchant therefor. The first etch mask is formed to cover the areas of the transparent conducting layers, as well as to define the pattern of the metal strip conductors.

According to one embodiment of the invention, the transparent conducting layers are patterned before depositing the first metal film, and the first etch mask covers each of the transparent conducting layers and defines the pattern of the metal strip conductors, such that the transparent conducting layers are not exposed to the etchant during etching of the first metal film.

According to another embodiment of the invention, the transparent conducting film for forming the transparent conducting layers is deposited over a second predetermined area of the substrate including the areas where the transparent conducting layers are to be formed and has a first edge along which the connecting portions of the transparent conducting layers are to terminate. The first metal film is then deposited to overlap the first edge of the transparent conducting film without extending into the areas where the electrode portions of the transparent conducting layers are to be formed. The first etch mask is formed to define the pattern of the transparent conducting layers and the pattern of the metal strip conductors, such that both the transparent conducting film and the first metal film are patterned using the first etch mask. The etching of the transparent conducting film and the first metal film may be performed in two steps using a separate etchant for each one of the two films or in one step using a single etchant suitable for etching both films. For example, if the transparent conducting film comprises indium tin oxide or $SnO_2$ and the first metal film comprises aluminum, etching may initially proceed in a mixture of phosphoric acid and nitric acid to remove the unmasked portions of the first metal film and then in a mixture of ferric chloride and hydrochloric acid to remove the unmasked portions of the transparent conducting film. Alternatively, etching of both films may proceed in a mixture of ferric chloride and hydochloric acid. If the first etch mask is made of photoresist, it is advantageous to re-bake the mask at least after the etching of the first metal film, if the etching takes place in two steps, or at least once during the etching of both films, if the etching is performed in a single step.

According to still another embodiment of the present invention, the transparent conducting film is deposited over substantially the entire substrate surface. Thereafter, the first metal film is deposited over the first predetermined area of the substrate surface overlapping a portion of the areas where the connecting portions of the transparent conducting layers are to be formed without extending into the areas where the electrode portions of such layers are to be formed. A first etch mask is then formed which defines the pattern of the transparent conducting layers and the pattern of the metal strip conductors. Etching then takes place in one or two steps as in the preceding embodiment. The metal strip conductors that are formed each have a respective underlying strip of transparent conducting material.

BRIEF DESCRIPTION OF THE DRAWING

For a better understanding of the invention, reference is made to the following detailed description of exemplary embodiments thereof, taken in conjunction with the accompanying drawing, in which.

Throughout the figures of the drawing, the same reference numerals or characters are used to denote like components, portions or features of the illustrated devices.

DETAILED DESCRIPTION

Figure 1:
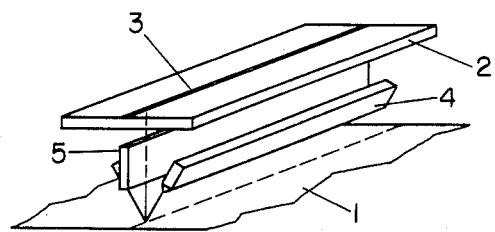
FIG. 1 is a schematic illustration of a typical image scanning arrangement used in facsimile equipment.
Figure 2:
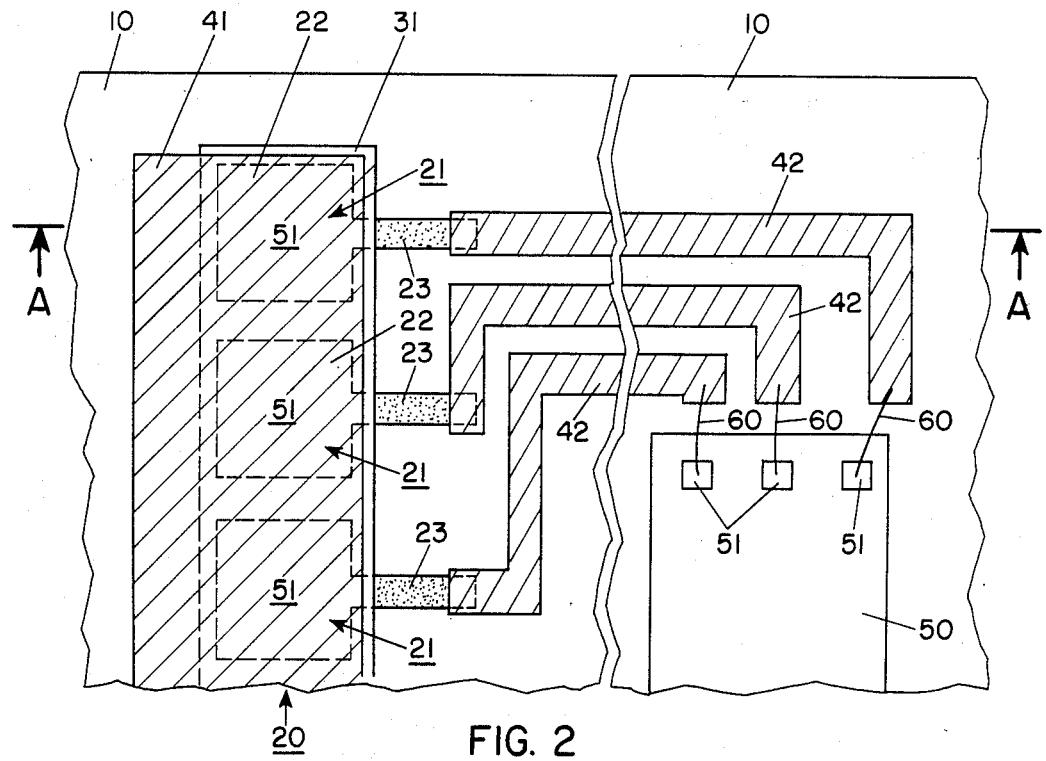
FIG. 2 is a partial plan view of an exemplary thinfilm photodiode array image sensor including a schematic representation of an integrated circuit mounted on the substrate for the reading and processing of photodetection signals produced by the photodiode array.
Figure 3:
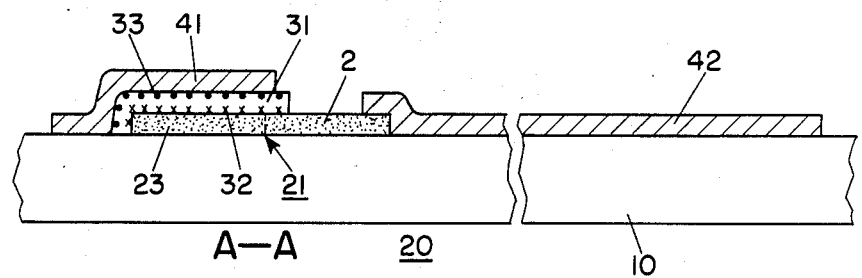
FIG. 3 is a sectional view of the image sensor of FIG. 2 taken along section line A—A of FIG. 2.
Figure 4:
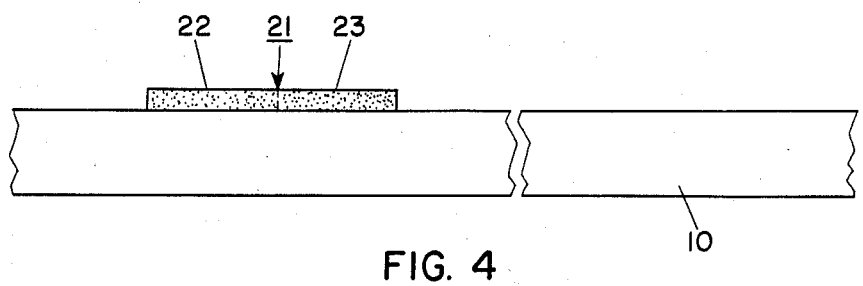
FIG. 4 is a sectional view of a partially fabricated image sensor after the formation of the transparent conducting layers on a major surface of a transparent substrate.
Figure 5:
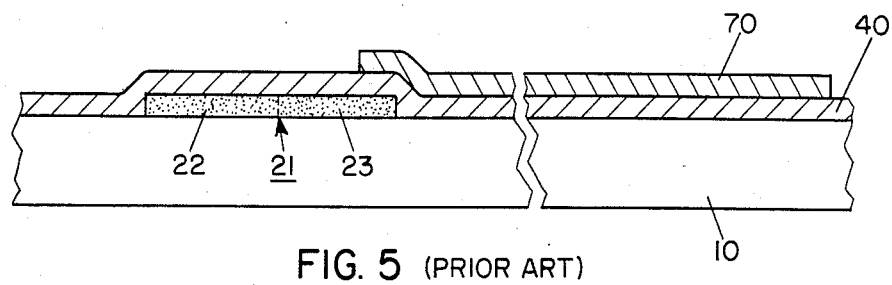
FIG. 5 is a sectional view of a partially fabricated image sensor after deposition of a first metal film and formation of a photoresist etch mask for the first metal film, illustrating a technique for forming the metal strip conductors according to the prior art.
Figure 6:
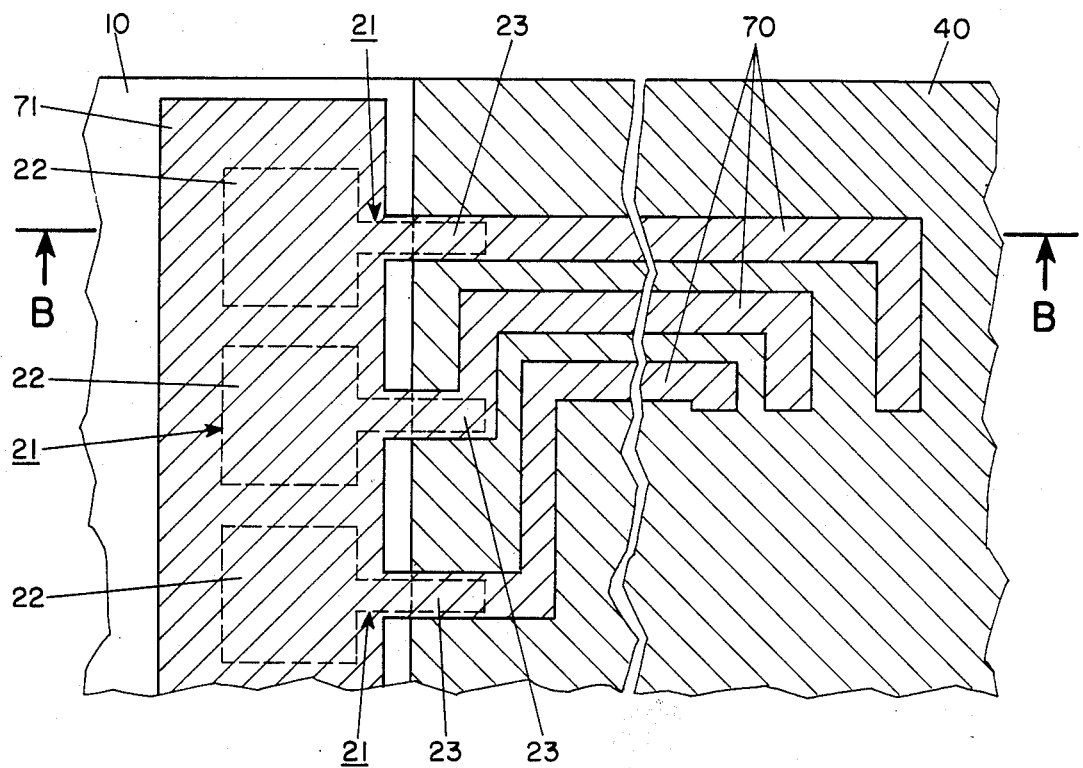
FIG. 6 is a partial plan view of a partially fabricated image sensor after formation of the transparent conducting layers, deposition of the first metal film and formation of an etch mask defining the pattern of metal strip conductors and covering the transparent conducting layers, illustrating a technique for forming the metal strip conductors according to one embodiment of the present invention.
Figure 7:
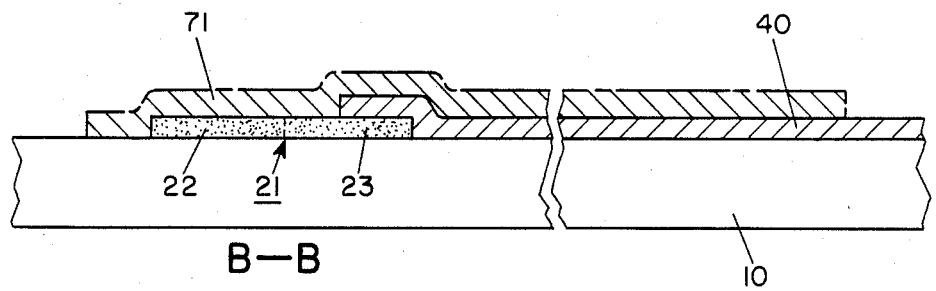
FIG. 7 is a sectional view of the partially fabricated image sensor of FIG. 6 taken along section line B—B of FIG. 6.

Referring now to FIGS. 6 and 7, there are shown plan and sectional views of a partially fabricated image sensor illustrating a technique for forming the metal strip conductors 42 shown in FIG. 2, in accordance with one embodiment of the present invention. Initially, a plurality of transparent conducting layers 21 having the same shapes and dimensions as those of the image sensor of FIGS. 2 and 3 are formed on a major surface of the substrate 10 using the same technique as described above. Thereafter, a first aluminum film 40 of approximately 1 μm in thickness is deposited over a predetermined area of the major surface of the substrate 10, which includes the area where the metal strip conductors 42 (shown in FIG. 2) are to be formed and which partially overlaps the area of each of the connecting portions 23 of the transparent conducting layers 21 (shown in FIG. 2) without extending into the areas of the electrode portions 22 of such layers. Since the overlap of the aluminum film 40 and the transparent insulating layers 21 can vary by nearly the length of the connecting portions thereof, the aluminium film 40 may be formed by conventional electron beam evaporation using an appropriately patterned mask positioned in front the major surface of the substrate 10 during the deposition.

Following the formation of the aluminum film 40, a photoresist etch mask 71 is formed over the substrate 10 using conventional photolithographic techniques. A thin layer of photoresist is first applied over the major surface of the substrate 10. After application, the photoresist layer is given a pre-exposure bake to remove the resist solvent and to improve the adhesion of the resist to the underlying material. An appropriate mask pattern is then exposed on the surface of the photoresist layer using UV light. Before exposure, the mask pattern is aligned to existing alignment features on the substrate surface. Thereafter, the exposed photoresist layer is developed, rinsed of developer solution and dried. A post development bake (post bake) of the patterned photoresist layer 71 at approximately 120° C. is used to give the layer better adhesion for withstanding the subsequent etching process. The photoresist etch mask 71 is used to define the pattern of the metal strip conductors 42 (shown in FIG. 2) to be formed and to cover the transparent conducting layers 21.

After the formation of the photoresist etch mask 71, the substrate 10 is immersed into an etchant solution containing a 1:1 mixture of phosphoric acid and nitric acid to etch the aluminum film 40. Such etching removes the unmasked portions of the aluminum film 40 to provide the desired pattern for the metal strip conductors 42 (shown in FIG. 2). Since the transparent conducting layers 21 are covered by photoresist during the etching of the aluminum film 40, the material of such layers 21 are not reduced by the hydrogen which is released during the etching.

Following the etching of the aluminum film 40, the photoresist etch mask 71 is stripped off and processing of the image sensor may continue using the steps described above for forming the amorphous silicon device regions and the aluminum cathode electrode of the device. An advantageous structure for the image sensor is described and claimed in commonly assigned, copending U.S. patent application Ser. No. 801,933 filed contemporaneously herewith.

Figure 8:
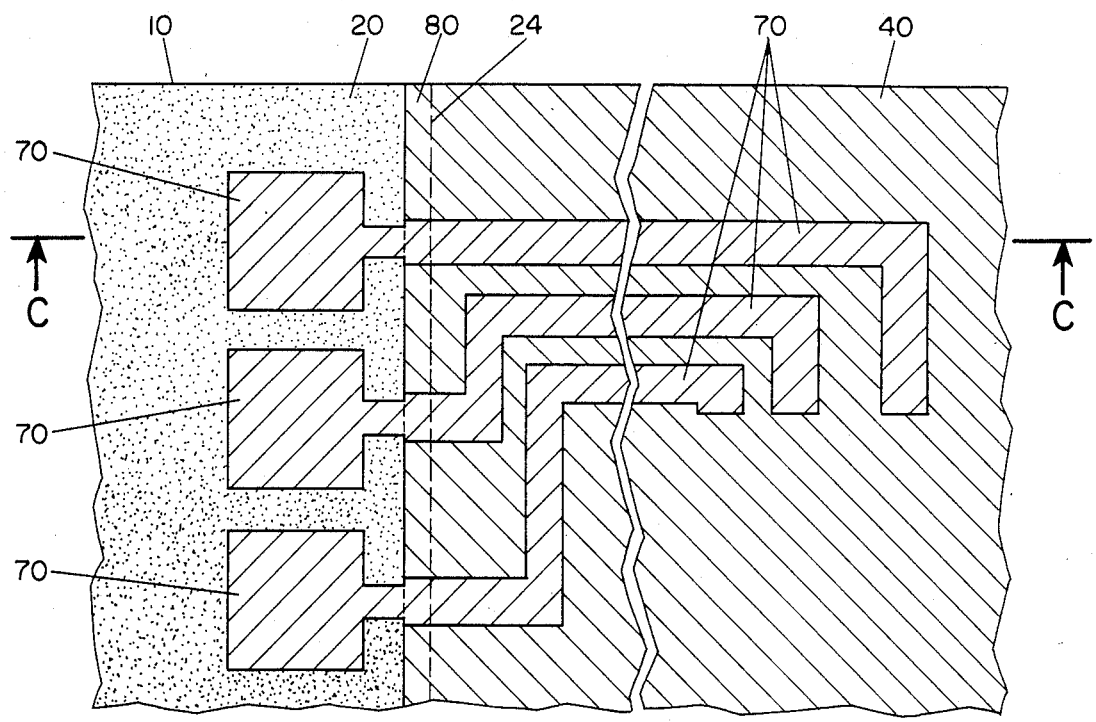
FIG. 8 is a partial plan view of a partially fabricated image sensor after deposition of a transparent conducting film, deposition of a first metal film and formation of a photoresist etch mask defining the pattern of the transparent conducting layers and the pattern of the metal strip conductors, illustrating a technique for forming the metal strip conductors according to another embodiment of the present invention.
Figure 9:
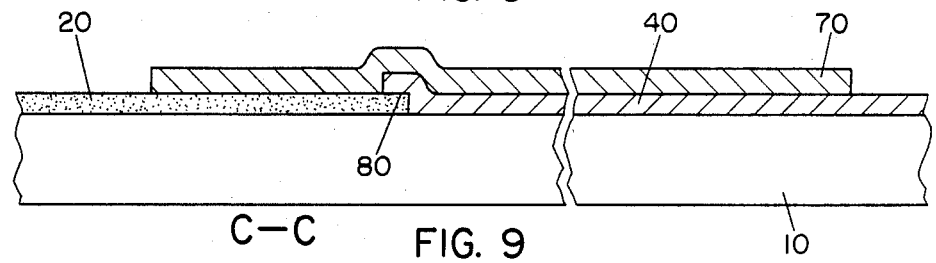
FIG. 9 is a sectional view of the partially fabricated image sensor of FIG. 8 taken along section line C—C of FIG. 8.
Figure 10:
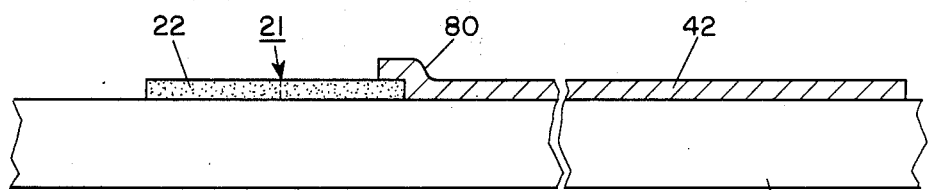
FIG. 10 is a sectional view of the partially fabricated image sensor of FIG. 9 after etching of the transparent conducting film and the first metal film and stripping of the photoresist etch mask.

Turning now to FIGS. 8, 9 and 10, there are shown plan and sectional views of a partially fabricated image sensor illustrating a technique for forming the metal strip conductors 42 shown in FIG. 2, in accordance with another embodiment of the present invention. A transparent conducting film 20 of either indium tin oxide or SnO₂ having a thickness in the range of 500–2000Å is first formed over a predetermined area of the substrate surface that includes the area in which the transparent conducting layers 21 (shown in FIG. 2) are to be formed. The transparent conducting film is bounded by an edge 24 along which the connecting portions 23 (shown in FIG. 2) of the transparent conducting layers are to terminate. Since the alignment tolerance of the transparent conducting film 20 with respect to the substrate surface is not critical, the film 20 may be formed by one of the aforementioned conventional deposition techniques using an appropriately patterned mask to cover the substrate surface during the deposition.

Following the deposition of the transparent conducting layer 20, a first aluminum film 40 identical to that of the previous embodiment is formed in the same manner to cover the area where the metal strip conductors 42 (shown in FIG. 2) are to be formed and to overlap the edge 24 of the transparent conducting film 20 without extending into the areas where the electrode portions 22 (shown in FIG. 2) of the transparent conducting layers 21 are to be formed.

After forming the aluminum film 40, a photoresist etch mask 70 is formed in the above-described manner to define not only the pattern of the metal strip conductors 42 but also the pattern of the transparent conducting layers 21. Thereafter, the substrate is immersed in a first etchant solution containing a 1:1 mixture of phosphoric acid and nitric acid to etch the aluminum layer 40. Following the removal of the unmasked portions of the aluminum film 40 to obtain the desired pattern for the metal strip conductor 42, the substrate 10 is removed from the first etchant solution and immersed into a second etchant solution containing a mixture of ferric chloride and hydrochloric acid for etching the transparent conducting film 20. The second etching step removes the unmasked portions of the transparent conducting film to provide the desired pattern of the transparent conducting layers 21. The mixture of ferric chloride and hydrochloric acid is advantageously diluted with water by approximate ten parts water to one part mixture, in order to obtain desirable etching times of several minutes.

It is advantageous to re-bake the photoresist etch masked 70, under the same conditions as the post-bake, after the etching of the aluminum layer 40. Such re-baking improves the adhesion of the photoresist etch mask 70 to the underlying transparent conducting film and aluminum film and reduces the tapering of the metal strip conductors caused by lateral etching of the masked portions of the aluminum film by the second etchant solution.

Instead of etching the transparent conducting film 20 and the aluminum film 40 in two separate etching steps, both films may be etched in one step by immersing the substrate into an etchant solution containing a mixture of ferric chloride and hydrochloric acid after forming the photoresist etch mask 70. In the latter instance, it is advantageous to re-bake the photoresist etch mask 70 more than once during the etching operation to obtain sharper etched patterns.

Following the etching of the transparent conducting film 20 and the aluminum film 40, the photoresist etch mask 70 is stripped, and further processing of the image sensor may proceed using the steps described above. The foregoing techniques for forming the metal strip conductors has the advantage in that only a single photolithography step is required for patterning both the transparent conducting film 20 and the aluminum film 40.

Figure 11:
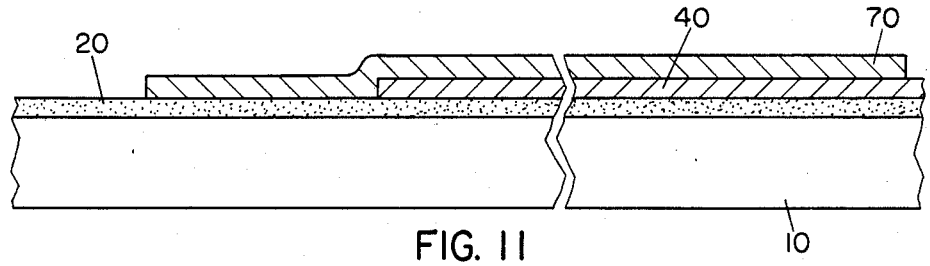
FIG. 11 is a sectional view of a partially fabricated image sensor after deposition of a transparent conducting film and a first metal film and formation of a photoresist etch mask defining the pattern of the transparent conducting layers and the pattern of the metal strip conductors, illustrating a technique for forming the metal strip conductors in accordance with still another embodiment of the present invention.
Figure 12:
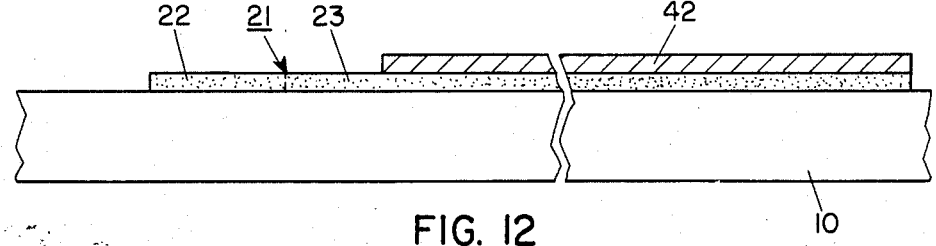
FIG. 12 is a sectional view of the partially fabricated image sensor of FIG. 10 after etching of the transparent conducting film and the first metal film and stripping of the photoresist etch mask.

Referring now to FIGS. 11 and 12, there are shown sectional views of a partially fabricated image sensor illustrating a technique for forming the metal strip conductors 42 according to still another embodiment of the present invention. Initially a transparent conducting film 20 of either indium tin oxide or $SnO_2$ is deposited over the entire substrate surface by one of the aforementioned conventional deposition techniques. Thereafter, a first aluminum film 40, identical to that of the preceding two embodiments is formed by the same technique to cover the area in which the metal strip conductors 42 (shown in FIG. 2) are to be formed and to overlap the areas in which the connecting portions 23 of the transparent conducting layers 21 (shown in FIG. 2) are to be formed without extending into the areas where the electrode portions 22 of such layers are to be formed.

Following the formation of the aluminum film 40, a photoresist etch mask 70 identical to that of the immediately preceding embodiment is formed to define the pattern of the transparent conducting layers 21 and the the pattern of the metal strip conductors 42. The transparent conducting film 20 and the aluminum film 40 are then etched in the same manner as in the immediately preceding embodiment to obtain the desired patterns for the transparent conducting layers 21 and the metal strip conductors 42. Each of the metal strip conductors thus formed has a respective underlying layer of transparent conducting material of the same shape.

After the formation of the transparent conducting layers 21 and the metal strip conductors 42, further processing of the image sensor may continue using the steps described above. The foregoing technique has the advantage in that the transparent conducting film 20 is deposited without requiring a mask over the substrate surface.

It will be understood that various modifications or alterations may be made to the foregoing exemplary embodiments by one skilled in the art without departing from the spirit and scope of the invention as defined in the appended claims. For example, the etch mask need not be made of photoresist and other types of lithography, such as electron beam lithography, may be used instead of photolithography. Furthermore, other wet or dry etchants having the required selectivity and control to provide accurate patterning of the transparent conducting film and the aluminum film may be substituted for the specific etchants used in the illustrative embodiments, and other appropriate semiconductor thin-films, such as those formed with CdS, may be substituted for the amorphous silicon film used in the disclosed embodiments.

We claim:

1. A method for fabricating thin-film photodiode array image sensors comprising the steps of:
   depositing a thin film of a transparent conducting material on a major surface of a transparent insulating substrate;
   patterning the transparent conducting film into a plurality of separate, regularly-spaced, transparent conducting layers each having a relatively wide electrode portion and a relatively narrow, strip-like connecting portion;
   depositing a first thin metal film over a first predetermined area of the major surface of the substrate that partially overlaps the areas of the connecting portions of the transparent conducting layers without extending into the areas of the electrode portions thereof;
   patterning the first metal film into a plurality of metal strip-like conductors each contacting a respective one of the connecting portions of the transparent conducting layers, including forming a first etch mask over the major surface of the substrate after depositing the first metal film and etching the first metal film by exposing unmasked portions thereof to a suitable etchant therefor;
   depositing a thin film of semiconductor material over at least the electrode portions of the transparent conducting layers; and
   depositing a second thin metal film over the semiconductor film and the electrode portions of the transparent conducting layers, wherein said first etch mask is formed to cover all areas of the transparent conducting layers, such that the transparent conducting layers are not exposed to the etchant for the first metal layer during etching of the first metal film.

2. A method for fabricating thin-film photodiode array image sensors according to claim 1, wherein the step of patterning the transparent conducting film is performed before the step of depositing the first metal film and the first etch mask covers each of the transparent conducting layers and defines the pattern of the metal strip-like conductors.

3. A method for fabricating thin-film photodiode array image sensors according to claim 2, wherein the first etch mask comprises photoresist patterned by photolithography.

4. A method for fabricating thin-film photodiode array image sensors according to claim 3, wherein the transparent conducting film comprises indium tin oxide, the first metal film comprises aluminum and the etchant for the first metal film comprises a mixture of phosphoric acid and nitric acid.

5. A method for fabricating a thin-film photodiode array image sensors according to claim 3, wherein the transparent conducting material comprises $SnO_2$, the first metal film comprises aluminum and the etchant for the first metal film comprises a mixture of phosphoric acid and nitric acid.

6. A method for fabricating the film photodiode array image sensors according to claim 1, wherein the transparent conducting film is deposited over a second predetermined area of the major surface of the substrate including the areas where the transparent conducting layers are to be formed and having a first edge along which the connecting portions of the transparent conducting layers are to terminate, the first metal film being deposited to only overlap the first edge of the transparent conducting film and the first etch mask defining the pattern of the transparent conducting layers and the pattern of the metal strip-like conductors, such that both the transparent conducting film and the first metal film are patterned using the first etch mask.

7. A method for fabricating thin-film photodiode array image sensors according to claim 6, wherein the first etch mask comprises photoresist patterned by photolithography.

8. A method for fabricating thin-film photodiode array image sensors according to claim 7, wherein unmasked portions of the transparent conducting film and of the first metal film are initially exposed to a first etchant suitable for etching the first metal film and then to a second etchant suitable for etching the transparent conducting film.

9. A method for fabricating thin-film photodiode array image sensors according to claim 8, wherein the transparent conducting film comprises indium tin oxide, the first metal film comprises aluminum, the first etchant comprises a mixture of phosphoric acid and nitric acid and the second etchant comprises a mixture of ferric chloride and hydrochloric acid.

10. A method for fabricating thin-film photodiode array image sensors according to claim 9, wherein the first photoresist etch mask is baked after the etching of the first metal film in the first etchant.

11. A method for fabricating thin-film photodiode array image sensors according to claim 8, wherein the transparent conducting film comprises $SnO_2$, the first metal film comprises aluminum, the first etchant comprises a mixture of phosphoric acid and nitric acid and the second etchant comprises a mixture of ferric chloride and hydrochloric acid.

12. A method for fabricating thin-film photodiode array image sensors according to claim 11, wherein the first photoresist etch mask is baked after the etching of the first metal film in the first etchant.

13. A method for fabricating thin-film photodiode array image sensors according to claim 7, wherein the unmasked portions of the transparent conducting film and of the first metal film are exposed to an etchant suitable for etching both the first metal film and the transparent conducting film.

14. A method for fabricating thin-film photodiode array image sensors according to claim 13, wherein the transparent conducting film comprises indium tin oxide, the first metal film comprises aluminum and the etchant comprises a mixture of ferric chloride and hydrochloric acid.

15. A method for fabricating thin-film photodiode array image sensors according to claim 14, wherein the first photoresist etch mask is baked at least once during the etching of the transparent conducting film and the first metal film.

16. A method for fabricating thin-film photodiode array image sensors according to claim 13, wherein the transparent conducting film comprises $SnO_2$, the first metal film comprises aluminum and the etchant comprises a mixture of ferric chloride and hydrochloric acid.

17. A method for fabricating thin-film photodiode array image sensors according to claim 16, wherein the first photoresist etch mask is baked at least once during the etching of the transparent conducting film and the first metal film.

18. A method for fabricating thin-film photodiode array image sensors according to claim 1, wherein the transparent conducting film is deposited over substantially the entire major surface of the substrate, the first metal film being deposited over the first predetermined area of the major surface of the substrate without extending into areas where the electrode portions are to be fored, before patterning of the transparent conducting film, the first etch mask defining the pattern of the transparent conducting layers and the pattern of the metal strip-like conductors, and both the transparent conducting film and the first metal film being patterned using the first etch mask, such that after patterning of the transparent conducting film and the first metal film each of the metal strip-like conductors has a respective underlying strip of the transparent conducting material.

* * * * *